United States Patent [19]

Nawata

[11] Patent Number: 4,920,278

[45] Date of Patent: Apr. 24, 1990

[54] PHASE COMPARATOR

[75] Inventor: Hizuru Nawata, Tokyo, Japan

[73] Assignee: NEC Corporation, Japan

[21] Appl. No.: 197,851

[22] Filed: May 24, 1988

[30] Foreign Application Priority Data

May 26, 1987 [JP] Japan .................. 62-128971

[51] Int. Cl.$^5$ ..................... H03K 5/00; H03K 9/06
[52] U.S. Cl. ................... 307/262; 307/511;
328/155; 328/55; 328/133
[58] Field of Search ........... 328/133, 155, 55, 109;
331/1 A; 307/262, 511

[56] References Cited

U.S. PATENT DOCUMENTS

| 3,242,262 | 3/1966 | Melas et al. ............ 329/50 |
| 3,500,399 | 3/1970 | Norris, Jr. ............ 328/133 |
| 3,548,321 | 5/1968 | Duquesne ............ 328/133 |
| 4,383,324 | 5/1983 | Dudek et al. ............ 329/50 |
| 4,549,142 | 10/1985 | Yoshida ............ 329/50 |
| 4,577,157 | 3/1986 | Reed ............ 329/50 |
| 4,675,614 | 6/1987 | Gehrke ............ 328/133 |
| 4,710,814 | 12/1987 | Gassmann et al. ............ 328/133 |

Primary Examiner—Stanley D. Miller
Assistant Examiner—Richard Roseen
Attorney, Agent, or Firm—Laff, Whitesel, Conte & Saret

[57] ABSTRACT

A phase comparator included in a phase locked loop (PLL) for comparing two input signals with respect to phase to thereby determine their phase difference includes two multipliers and two low-pass filters for producing a sine component signal and a cosine component signal which are associated with the phase difference. A discrimination signal representative of a polarity is generated on the basis of one of those two component signals, and a phase error signal is generated on the basis of the other of them. The phase error signal monotonously increases during predetermined one period which is determined by the discrimination signal, i.e. $(2n-1)\pi$ to $(2n+1)\pi$ where n is 0, ±1, ±2 and so on. A PLL using such a phase comparator is allowed to rapidly converge to a stable point even when the phase error is close to an unstable point, i.e., $\pm(2n-1)$ where n is 0, 1, 2 and so on, achieving an extremely short acquisition time.

4 Claims, 10 Drawing Sheets

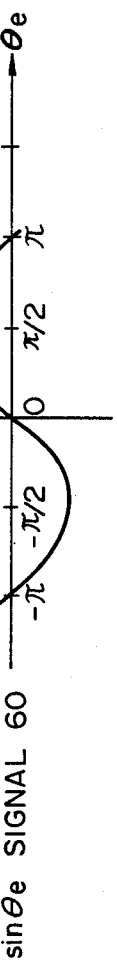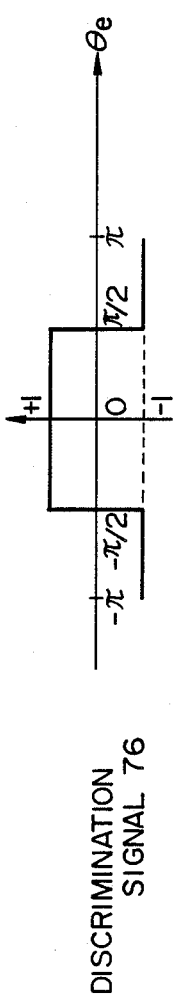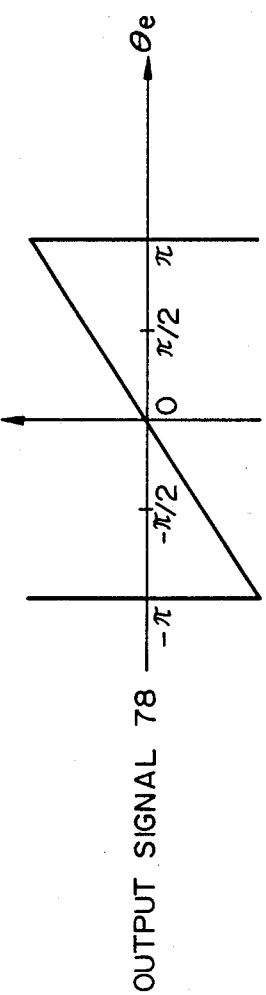
FIG. 6A  sin θe SIGNAL 60
FIG. 6B  DISCRIMINATION SIGNAL 76
FIG. 6C  OUTPUT SIGNAL 78

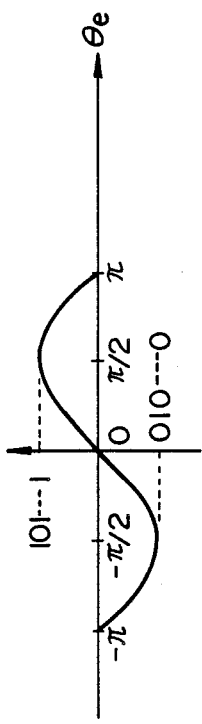
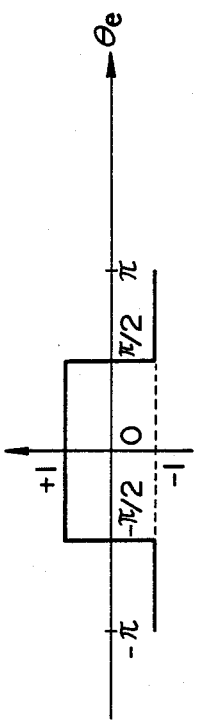
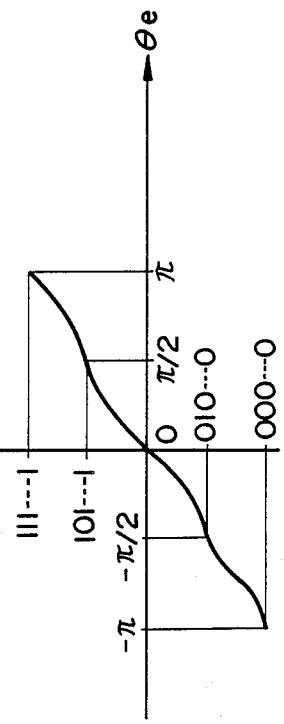
FIG. 9A DIGITAL SIGNAL 94
FIG. 9B DISCRIMINATION SIGNAL 76
FIG. 9C OUTPUT SIGNAL 78

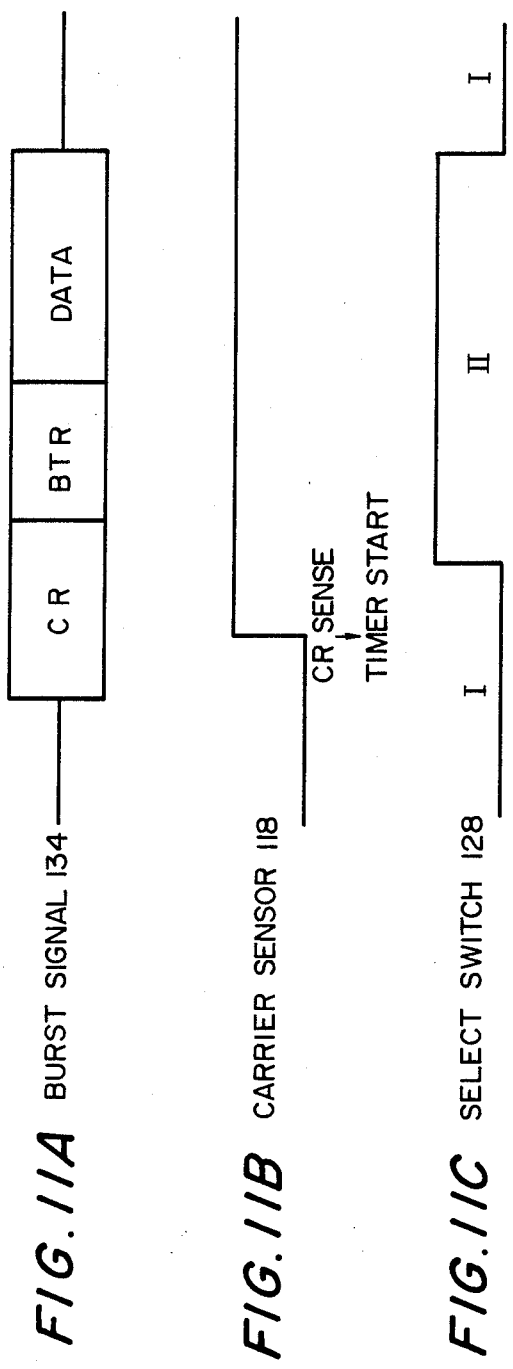

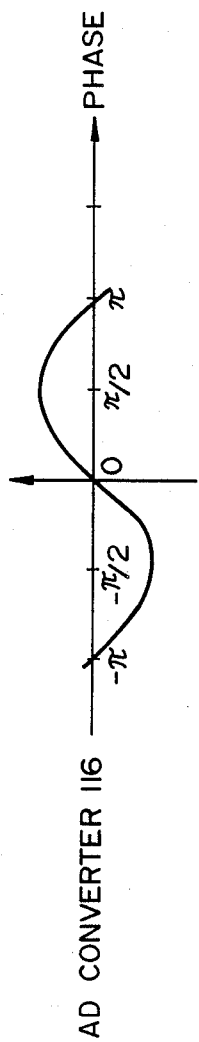
FIG. 12A   AD CONVERTER 116
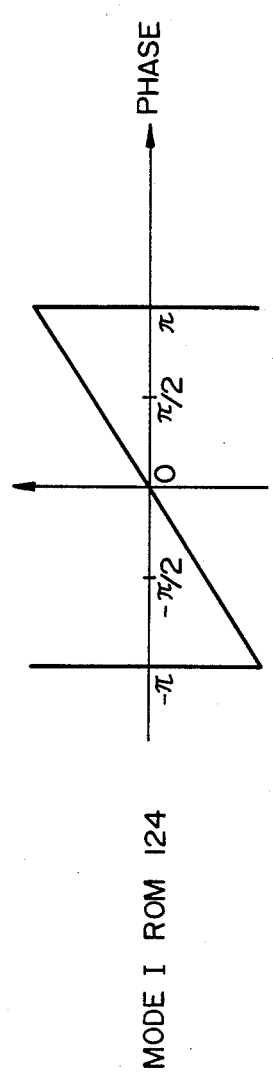
FIG. 12B   MODE I ROM 124
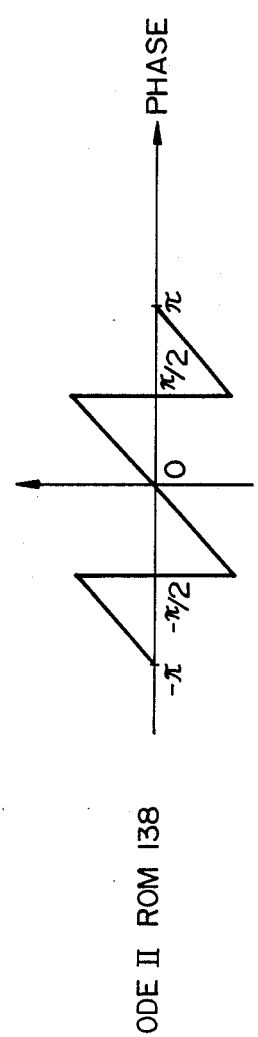
FIG. 12C   MODE II ROM 138

PHASE COMPARATOR

BACKGROUND OF THE INVENTION

The present invention relates to a phase comparator and, more particularly, to a phase comparator included in a phase locked loop (PLL) for comparing two input signals with respect to phase to produce their phase difference.

As well known in the art, a PLL includes a voltage controlled oscillator (VCO), a loop filter and a phase comparator which are interconnected in a loop. A modulated signal and a signal outputted by the VCO are applied to the phase comparator. Comparing the two input signals with respect to phase, the phase comparator determines their phase difference and feeds back the phase difference to the VCO via the loop filter. The PLL therefore serves to cause the phase of the VCO output to follow the phase of the modulated signal, and the phase comparator is an important element which dictates the characteristic of the PLL. When the phase comparator is implemented by a multiplier or a balanced mixer having a multiplying characteristic, the phase comparison characteristic is a sinusoidal characteristic as defined by the phase difference and the amplitude of a phase error signal which are represented by the abscissa and the ordinate, respectively. The amplitude of a phase error signal varies in conformity to the degree of phase difference so long as the phase difference lies in a monotonous increase range. promoting rapid acquisition. However, while the phase difference lies in a monotonous decrease range, the amplitude of a phase error signal decreases with the increase in phase difference with the result that a substantial period of time is needed for acquisition.

Various implementations have heretofore been proposed to eliminate the shortcoming discussed above. Among them, a phase comparator disclosed in Japanese Laid-Open Patent Publication (Kokai) No. 60-183,862 (corresponding to European Patent Publication No. 0,154,503) includes a conversion table which is constituted by a read-only memory (ROM). The conversion table or ROM table stores phase data in the form of digital signals which correspond to the combinations of amplitudes of a pair of digital signals that have a quadrature relation to each other. More specifically, the ROM serves as a polar coordinates conversion table in which the phase data are stored and are accessed by address data to produce the phase data. While a phase comparator of the type using a ROM which is accessed by a pair of digital signals as stated above may be successful in eliminating the drawback concerned, it is incapable of attaining a desired resolution unless the ROM has a large capacity. Although the recent semiconductor integrated circuit technology has accelerated the increase in the capacity of a storage, a large capacity storage is still expensive at the present stage of development. Moreover, a ROM having a desired capacity is not always easy to obtain. Should a ROM having a desired capacity be implemented as a plurality of ROMs which are comparatively easy to obtain, the ROMs would scale up the circuitry and thereby obstruct the miniaturization of a phase comparator.

SUMMARY OF THE INVENTION

It is therefore an object of the present invention to provide a phase comparator which allows a PLL to rapidly converge to a stable point even when a phase difference is close to an unstable point of the PLL.

It is another object of the present invention to provide a phase comparator which can be constituted by parts which are inexpensive and easy to obtain.

It is another object of the present invention to provide a generally improved phase comparator.

A phase comparator for comparing two input signals with respect to phase to produce a phase difference between the two input signals of the present invention comprises a multiplier supplied with a modulated signal and a reference signal which constitute the two input signals for producing an output signal which is representative of a product of the modulation signal and the reference signal, a low-pass filter for filtering the output signal of the first multiplier to produce a filtered output signal, a $\pi/2$ phase shifter for shifting a phase of the reference signal by $\pi/2$ to produce a phase shifted output signal, a second multiplier supplied with the modulated signal and the phase shifted output signal for producing an output signal which is representative of a product of the modulated signal and the phase shifted output signal, a second low-pass filter for filtering the output signal of the second multiplier to produce a filtered output signal, a polarity discriminator supplied with one of the output signals of the first low-pass filter and the second low-pass filter means for producing a discrimination signal which is representative of a positive half and a negative half of a period of the one output signal, and a phase error converting circuit supplied with the other of the output signals of the first low-pass filter and the second low-pass filter and the discrimination signal for producing a phase error signal which, when the discrimination signal is representative of the positive half, monotonously increases within one period of the other output signal which is associated with the positive half.

BRIEF DESCRIPTION OF THE DRAWINGS

The above and other objects, features and advantages of the present invention will become more apparent from the following detailed description taken with the accompanying drawings in which:

FIGS. 6A to 6C are plots demonstrating the operation of the phase comparator as shown in FIG. 5;

FIGS. 9A to 9C are plots demonstrating the operation of the phase error converting circuit of FIG. 8;

FIG. 11A is a diagram showing the format of a burst signal;

FIGS. 11B, 11C and 12A to 12C are diagrams demonstrating the operation of the demodulator as shown in FIG. 10;

DESCRIPTION OF THE PREFERRED EMBODIMENT

Figure 1:
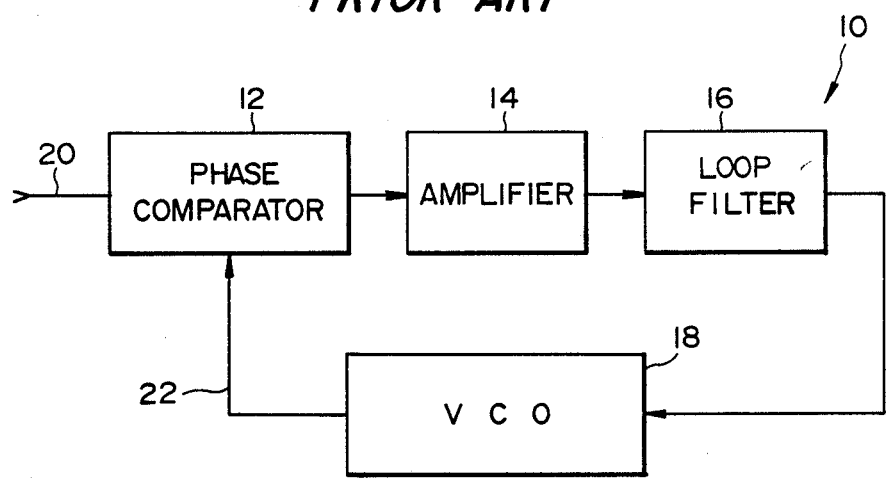
FIG. 1 is a schematic block diagram showing an ordinary PLL.

To better understand the present invention, a brief reference will be made to a prior art phase comparator and a PLL which uses it, shown in FIG. 1. As shown, a prior art PLL 10 includes a phase comparator 12, an amplifier 14, a loop filter 16, and a voltage controlled oscillator (VCO) 18. A signal 20 inputted to the PLL 10 and a signal 22 outputted by the VCO 18 are applied to the phase comparator 12. Comparing the two signals 20 and 22 with respect to phase, the phase comparator 12 feeds back their phase difference to the VCO 18 via the amplifier 14 and loop filter 16. Hence, the PLL 10 functions to cause the phase of the output signal 22 of the VCO 18 to follow the phase of the input signal 20, and the phase comparator 12 determines the characteristic of the PLL 10. The input signal 20 is a signal which has undergone digital modulation, i.e., a sine-wave signal, a cosine-wave signal or a combination thereof. Such a signal may even be implemented by an ASK (Amplitude Shift Keying) signal, a PSK (Phase Shift Keying) signal or a FSK (Frequency Shift Keying) signal. On the other hand, the output signal 22 of the VCO 18 is one of a sine-wave and a cosine wave signal and serves as a reference signal on which the operation of the phase comparator 12 is based. Thus, the two input signals to the phase comparator 12 are a digitally modulated signal and a reference signal as stated above.

Figure 2:
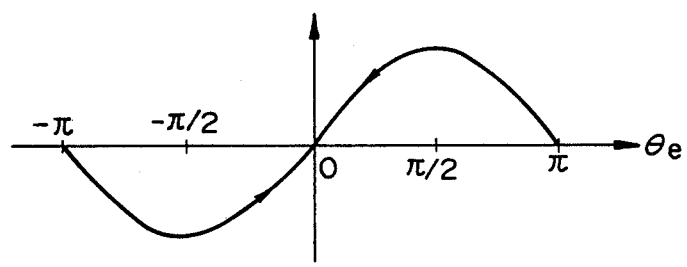
FIG. 2 is a plot showing a phase comparison characteristic particular to a phase comparator which is included in the PLL of FIG. 1 and implemented by a multiplier.

In the case that the phase comparator 12 is implemented by a multiplier or a balanced mixer having a multiplying characteristic, it exhibits a sine-wave characteristic as shown in FIG. 2. In FIG. 2, the abscissa indicates the phase error $\theta_e$ while the ordinate indicates the amplitude of a phase error signal. As shown, while the phase error $\theta_e$ remains greater than $-\pi/2$ and smaller than $+\pi/2$, i.e., during a monotonous increase range, the amplitude of the phase error signal varies in conformity to the phase error $\theta_e$. This means that the PLL 10 is capable of performing smooth acquisition so long as the phase error $\theta_e$ lies in the monotonous increase range. However, as the phase error $\theta_e$ becomes greater than $+\pi/2$ and smaller than $+\pi$, i.e., during a monotonous decrease range, the amplitude of the phase error signal decreases as the phase error $\theta_e$ increases. The PLL 10, therefore, needs a substantial acquisition time when the phase error $\theta_e$ lies in such a monotonous decrease range. Assuming a PLL whose phase comparator has a sine-wave phase comparison characteristic, it is stable when the phase error $\theta_e$ is equal to $\pm 2n\pi$ and unstable when the phase error $\theta_e$ is $\pm(2n+1)\pi$ where n is 0, 1, 2 and so on, as generally accepted. When the phase error $\theta_e$ is close to the point where the loop is unstable, the convergence of a PLL to the above-mentioned stable point is extremely slowed down.

Figure 3:
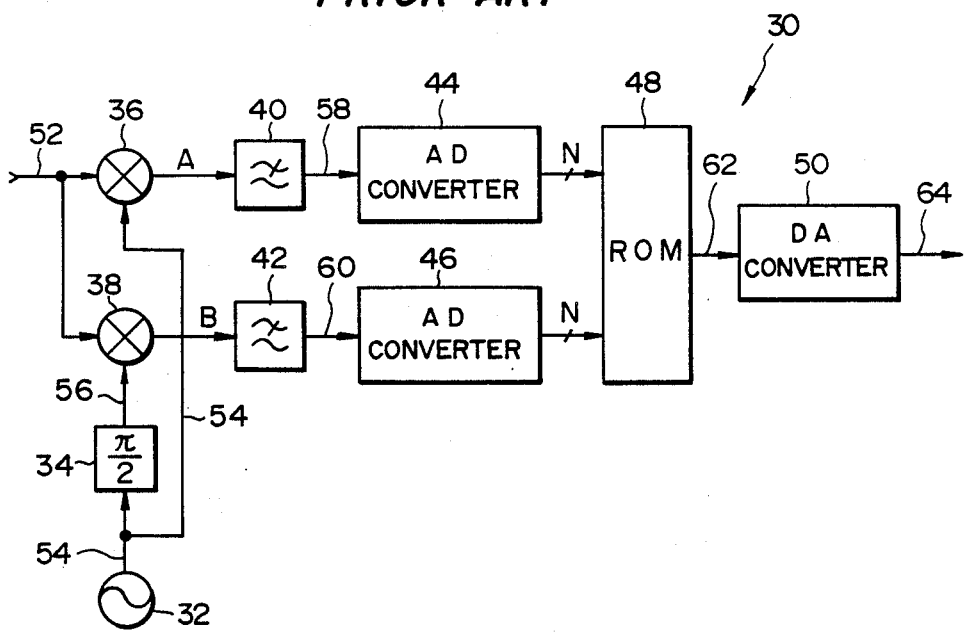
FIG. 3 is a schematic block diagram showing a prior art phase comparator which uses a ROM.

A prior art implementation for eliminating the above shortcoming relies on a conversion table in which phase data are stored in the form of digital signals that are associated with the combinations of amplitudes of a pair of mutually orthogonal digital signals, as disclosed in the previously mentioned Japanese Laid-Open Patent Publication (Kokai) 60-183,862 by way of example. The conversion table is constituted by a ROM. Although the Patent Publication does not show or describe any specific circuit for accessing the ROM, a phase comparator involved in its concept is presumed to have such a construction as shown in FIG. 3. In FIG. 3, the phase comparator 30 is made up of a reference signal generator 32, a $\pi/2$ phase shifter 34, multiplier 36 and 38, low-pass filters 40 and 42, analog-to-digital (AD) converters 44 and 46, a ROM 48, and a digital-to-analog (DA) converter 50. The operation of the phase comparator 30 will be outlined hereunder.

An input signal 52 which may be expressed by $\sqrt{2} \cos(\omega t - \theta_A)$ is applied to one input of the multipliers 36 and 38. The reference signal generator 32 produces a reference signal 54 which is represented by $\sqrt{2} \cos(\omega t - \theta_B)$ and delivers it to the other input of the multiplier 36 and the $\pi/2$ phase shifter 34. In response, the $\pi/2$ phase shifter 34 advances the phase of the reference signal 54 by $\pi/2$ to output a $\pi/2$ phase shifted signal 56 which is expressed by $\{\sqrt{2} \sin(\omega t + \theta_B)\}$, the signal 56 being fed to the other input of the multiplier 38. The multiplier 36 produces a product A of the two inputs 52 and 54 and applies it to the low-pass filter 40. The product A of the signals 52 and 54 is expressed as:

$$A = \sqrt{2} \cos(\omega t + \theta_A) \times \sqrt{2} \cos(\omega t + \theta_B) \quad (1)$$

Therefore, by an addition theorem $$A = \cos(\theta_B - \theta_A) + \cos 2\omega t \cos(\theta_A + \theta_B) - \sin 2\omega t \sin(\theta_A + \theta_B) \quad (2)$$

Since the second and third terms of the Eq. (2) are removed by the low-pass filter 40, the output of the low-pass filter 40 is a cos signal 58 which is represented by $\cos(\theta_B - \theta_A)$. The multiplier 38 produces a product of the two inputs 52 and 56 and feeds it to the low-pass filter 42. The product B is produced by:

$$B = \sqrt{2} \cos(\omega t + \theta_A) \times \sqrt{2} \sin(\omega t + \theta_B) \quad (3)$$

Therefore, by an addition theorem $$B = \sin(\theta_B - \theta_A) + \cos 2\omega t \sin(\theta_A + \theta_B) + \sin 2\omega t \cos(\theta_A + \theta_B) \quad (4)$$

The second and third terms of the Eq. (4) are also removed by the low-pass filter 42 so that the low-pass filter 42 produces a sin signal 60, i.e. $\sin(\theta_B + \theta_A)$. In the Eqs. (2) and (4), $(\theta_B - \theta_A)$ is the previously stated phase error $\theta_e$. The wave-form shown in FIG. 2 is representative of the sin signal 60.

Figure 4:
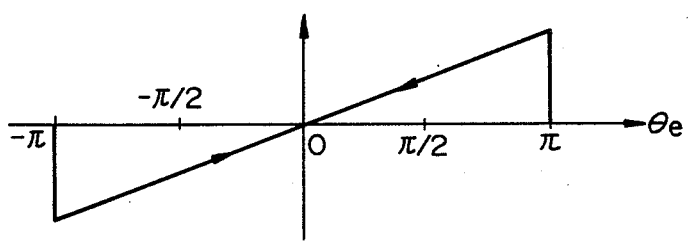
FIG. 4 is a plot showing a phase comparison characteristic particular to the phase comparator of FIG. 3.

The AD converters 44 and 46 respectively convert the cos signal 58 and the sin signal 60 into N-bit digital signals and deliver them to the ROM 48 as address data. In this manner, the ROM 48 is accessed by a pair of digital signals. The ROM 48 serves as a polar coordinates conversion table in which phase data are stored and generates a phase data signal 62 which is associated with the address data. The phase data signal 62 is fed out as an output signal 64 of the phase comparator 30 via the DA converter 50. Consequently, as shown in FIG. 4, the phase error $\theta_e$ obtains a monotonously increasing characteristic when the phase error $\theta_e$ is greater than $-\pi$ and smaller than $+\pi$, whereby the convergence rate in the vicinity of the aforementioned unstable point ($\pm\pi$) is increased.

A drawback with a phase comparator described above which accesses a ROM with a pair of digital signals is that a desired resolution is unattainable unless the ROM has a considerable capacity. Assuming that each of the AD converters 44 and 46 produces an N-bit output, 2N bits of addresses are needed because two AD converters 44 and 46 are connected to the address input of the ROM 48, resulting in the need for a ROM whose capacity is as large as $2^{2N}$ words. Although the recent progress in semiconductor integrated circuit technology has accelerated the increase in the capacity of a storage, a large capacity storage is still expensive at the present stage of development and, moreover, a ROM whose capacity matches with the above-stated conditions is not always easy to obtain. Should the ROM having a desired capacity be implemented as a plurality of ROMs which are comparatively easy to obtain, the circuit scale would be increased to obstruct the miniaturization of a phase comparator.

Figure 5:
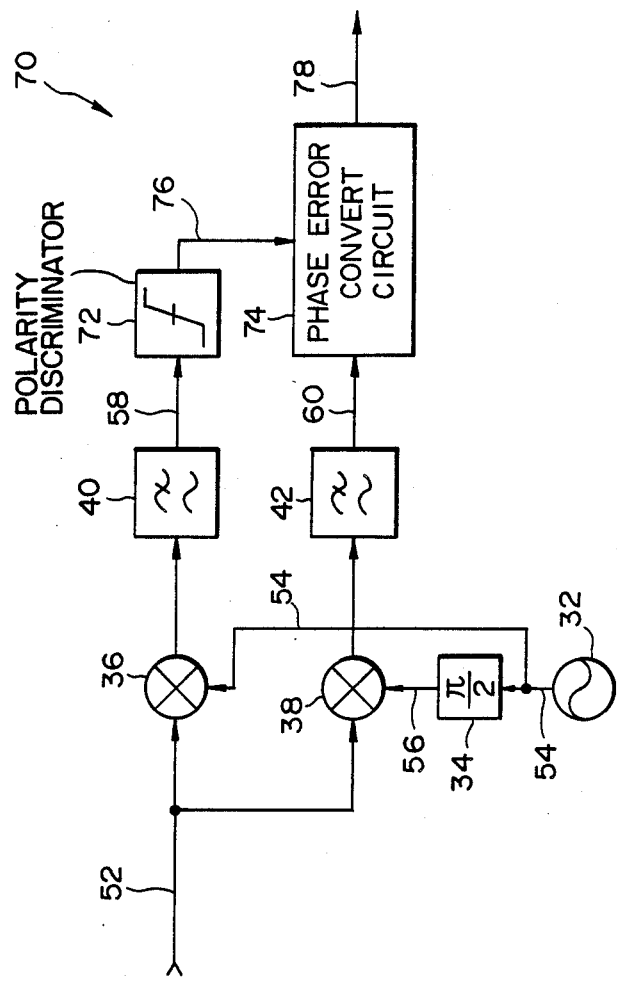
FIG. 5 is a schematic block diagram showing a phase comparator embodying the present invention.

Referring to FIG. 5, a phase comparator embodying the present invention is shown and generally designated by the reference numeral 70. In FIG. 5, the same or similar structural elements as those shown in FIG. 3 are designated by like reference numerals.

In FIG. 5, the phase comparator 70 includes a polarity discriminator 72 which is connected to the output of a low-pass filter 40. A phase error converting circuit 74 is connected to the output of the polarity discriminator 72 and produces a desired output signal 78 of the phase comparator 70. The low-pass filter 42 produces a sin signal 60 which is represented by $\sin(\theta_B - \theta_A)$, i.e., sin $\theta_e$, as previously stated. The sin signal 60 is applied to one input of the phase error converting circuit 74. FIG. 6A shows the wave-form of the sin signal 60 which appears during one period and which is the same as the wave-form of FIG. 2. The low-pass filter 40 outputs a cos signal 58 which is represented by $\cos(\theta_B - \theta_A)$, i.e., $\cos\theta_e$, as stated earlier. The cos signal 58 is fed to the polarity discriminator 74. In response, the polarity discriminator 74 discriminates the polarity of the cos signal 58 to thereby produce a discrimination signal 76 which remains at a "+1" level during a positive half of the period and at a "−1" level during a negative half of the period. This signal 76 is applied to the phase error converting circuit 76. FIG. 6B shows the discrimination signal 76 which occurs during one period of the sin signal 60, in relation to the wave-form of FIG. 6A. As shown in FIGS. 6A and 6B, the amplitude of the sin signal 60 monotonously increases while the discrimination signal 76 has the "+1" level and monotonously decreases when it has the "−1" level. That is, a monotonous decrease period can be identified on the basis of the content of the discrimination signal 76.

Receiving the sin signal 60 and discrimination signal 76, the phase error converting circuit 74 converts the above-mentioned monotonous decrease into a monotonous increase to thereby produce the output 78 of the phase comparator 70. The signal 78, therefore, has a phase comparison characteristic which is equivalent to the characteristic shown in FIG. 4 (see FIG. 6C). More specifically, the characteristic is such that, assuming n which is 0, $\pm 1$, $\pm 2$ and so on, the output signal 78 monotonously increases over the range of $(2n-1)\pi$ to $(2n+1)\pi$ when the phase error lies in such a range. It follows that a PLL which is implemented by the phase comparator 70 is capable of rapidly converging to the stable point even when the phase error is close to the unstable point, i.e. $\pm(2n+1)$. In this case, n is 0, 1, 2 and so on.

Figure 7:
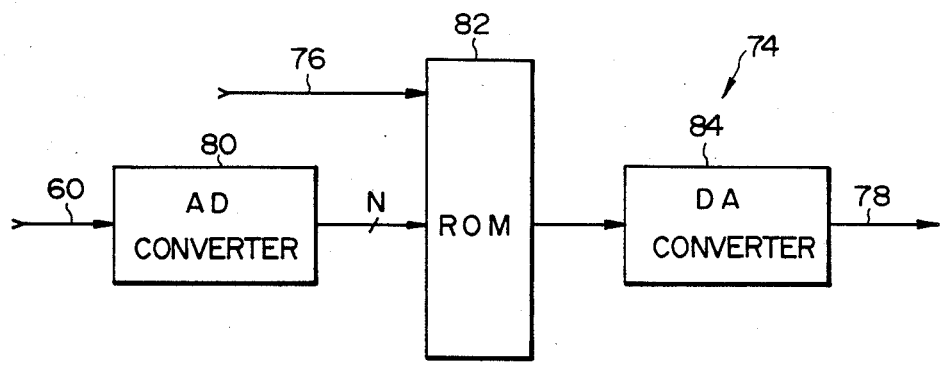
FIG. 7 is a schematic block diagram showing a specific construction of a phase error converting circuit which is included in the phase comparator of FIG. 5.

Referring to FIG. 7, a specific construction of the phase error converting circuit 78 is shown. Basically, the converting circuit 78 is made up of an AD converter 80, a ROM 82, and a DA converter 84. The AD converter 80 converts the sin signal 60 into a digital signal having a predetermined number of bits and delivers it to the ROM 82 as address data. In response to the output of the AD converter 80 and the discrimination signal 76, the ROM 82 feeds a predetermined phase error signal which is a digital signal to the DA converter 84. The ROM 82 serves as a conversion table which stores phase errors and amplitudes which are individually matched with the phase errors. Specifically, the ROM 82 produces a phase error signal whose amplitude monotonously increases in association with the phase error $\theta_e$ during one period of the sin signal 60 which extends from $-\pi$ to $+\pi$ and corresponds to the period in which the discrimination signal 76 remains at the "+1" level, i.e. over the range of $(2n-1)\pi$ to $(2n+1)\pi$ (n=0, 1, 2 ...). This phase error signal is fed out from the DA converter 84 as an output signal 78 of the phase comparator 70. The resulting phase comparison characteristic is shown in FIG. 6C.

As regards the capacity required for the ROM 82, $2^{N+1}$ words suffices because the address data of the ROM 82 is (N+1) bits where N is the number of conversion bits of the AD converter 80. The ROM 82, therefore, functions equivalently to the ROM 48 of the prior art phase comparator 30 with a capacity which is substantially one half of the latter. Hence, use can be made of a ROM having a small capacity which is easy to obtain.

Figure 8:
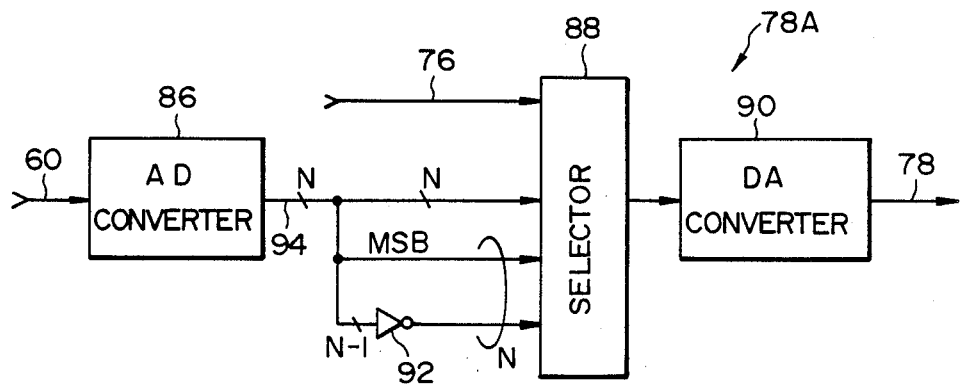
FIG. 8 is a block diagram similar to FIG. 7, showing another specific construction of the phase error converting circuit.

FIG. 8 shows another specific construction of the phase error converting circuit. As shown, a phase error converting circuit 78A basically comprises an AD converter 86, a selector 88, a DA converter 90, and an (N−1) inverter 92. The AD converter 86 converts the sin signal 60 into an N-bit digital signal and feeds the latter to the selector 88. Assuming that the sin signal 60 is fed to the AD converter 86 such that its peak level is half the dynamic range of the AD converter 86, the output signal 94 of the AD converter 86 is an N-bit digital signal which changes over a range between "010 ... 0" and "101 ... 1", as shown in FIG. 9A. The N-bit digital signal is directly applied as a first input to the selector 88. At the same time, a signal which is produced by inverting the polarity of the N-bit digital signal except for the most significant bit (MSB) is applied as a second input to the selector 88.

The selector 88 selects the first input when the discrimination signal 76 has the "+1" level and selects the second input when it has the "−1" level, the signal selected being fed to the DA converter 90. The discrimination signal 76 is shown in FIG. 9B. When the discrimination signal 76 remains at the "+1" level, i.e., during the interval between $-\pi/2$ and $+\pi/2$, the output of the AD converter 86 has a monotonously increasing characteristic and, therefore, this part is directly fed out. On the other hand, when the discrimination signal 76 has the "−1" level, the following operation occurs. The most significant bit of the N-bit digital signal outputted by the AD converter 86 is representative of the polarity of that signal. Since the other (N−1) bits of the digital signal have been inverted in polarity, the (N−1)- bit signal entered when the discrimination signal 76 has the "−1" level has a monotonously increasing waveform. Hence, (N−1) bits appearing in each of the interval between +π/2 and +π and the interval between −π/2 and −π are shifted in signal level and then connected to the signal wave-form which appears during the interval between −π/2 and +π/2. As a result, the DA converter 90 produces the phase error signal 78 which monotonously increases during the period of −π/2 to +π/2, i.e., (2n−1)π to (2n+1)π, as shown in FIG. 9C.

It is to be noted that the monotonously increasing characteristic includes some curves and is not strictly linear, as shown in FIG. 9C. When linearity is required, use may be made of the system shown in FIG. 7 which includes the ROM 82.

Hereinafter will be described an application of the phase comparator of the present invention to a demodulator which is adapted to demodulate a modulated bi-phase PSK burst signal.

Figure 10:
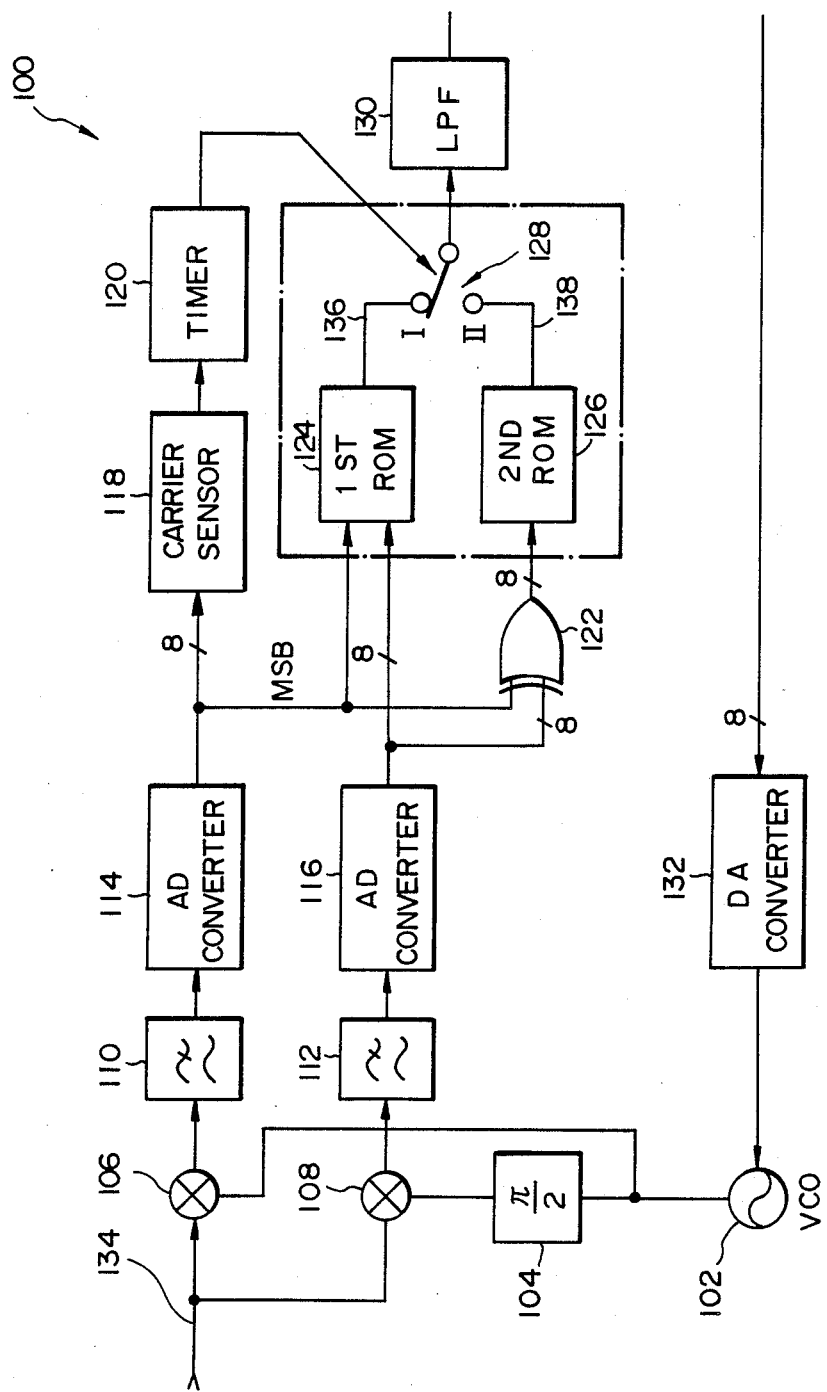
FIG. 10 is a block diagram schematically showing a demodulator for demodulating a burst signal and to which the present invention is applied.

Referring to FIG. 10, a demodulator 100 of the kind described above includes a reference signal generator 102 which is implemented by a VCO, a π/2 phase shifter 104, multipliers 106 and 108, low-pass filters 110 and 112, AD converters 114 and 116, a carrier sensor 118, a timer 120, an exclusive-OR (EX-OR) gate 122, a first ROM 124, a second ROM 126, a select switch 128, a low-pass filter 130, and a DA converter 132. A burst signal 134 which is inputted to the demodulator 100 is a bi-level PSK signal having a format in which a preamble is constituted by a CR (Carrier Recovery) section, i.e. a pattern which is all ONEs or all ZEROs, as shown in FIG. 11A.

Assuming that the select switch 128 has selected a mode I as illustrated, a phase detector of the demodulator 100 has a one-phase characteristic which is such that a PLL becomes stable at a single point when θ is equal to or greater than −π and equal to or smaller than +π. Specifically, when the CR section of the burst signal 134 is entered, the VCO 102 is locked to the input carrier. At this time, the acquisition rate is increased when θ is equal to or smaller than −π/2 and equal or greater than +π/2 because the output signal 136 of the first ROM 124 is monotonously increasing then (see FIG. 12B). This effectively shortens the CR section of the burst signal 134 which constitutes a preamble. When a recovered carrier is acquired with the CR section, the carrier sensor 118 senses the arrival of the burst signal 134 to start a timer 120 (see FIG. 11B). The timer 120 is constructed to presume, for example, a point immediately before a BTR section of the burst signal 134.

Upon the start of the timer 120, the select switch 128 is actuated to set up a mode II in place of the mode I (see FIG. 11C). In the mode II, a phase detector of the demodulator 100 obtains a bi-phase characteristic which is such that the PLL becomes stable at two points when θ is equal to or greater than −π and equal to or smaller than +π. At this time, the second ROM 126 produces an output signal 138 as shown in FIG. 12C. In this condition, the modulated bi-phase PSK signal can be stably modulated by rapid acquisition. FIG. 12A shows an output signal of the AD converter 116.

When the burst signal terminates, the select switch 128 is operated to replace the mode II with the mode I to prepare for the arrival of the next burst signal. So long as the length of a burst signal is known, the end of a burst signal may be presumed by using a timer which is triggered by the head of the burst signal. When the length of a burst signal is not known, a unique word may be added to the tail of a burst signal.

Figure 13:
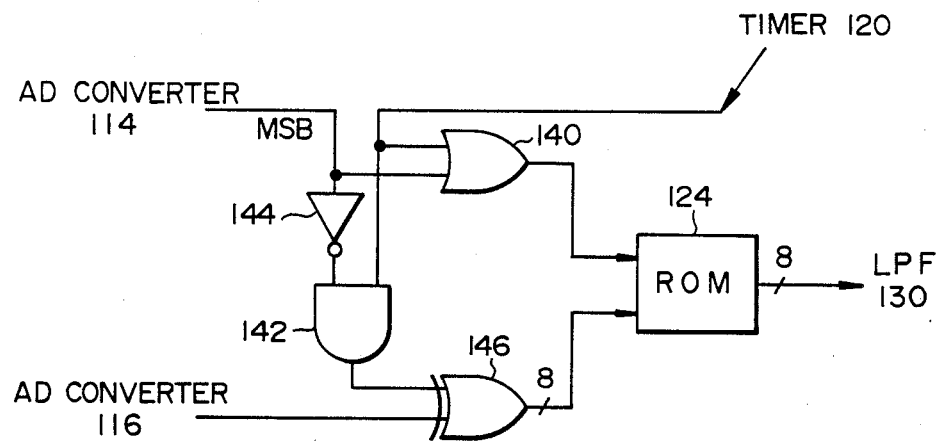
FIG. 13 is a schematic block diagram showing another specific construction of a part of the demodulator as shown in FIG. 10.

As shown in FIG. 3, that part of the demodulator 100 which includes the ROMs 124 and 126 and selector switch 128 and is defined by a dash-and-dot line in FIG. 10 may alternatively be constituted by the first ROM 124 only. This is because non-linear/linear conversion is effected in both of the modes I and II and, therefore, a part of the first ROM 124 can be directly used for the content of the second ROM 126. In the construction shown in FIG. 13, an output signal of the timer 120 is fed to one input terminal of an OR gate 140 and one input terminal of an AND gate 142, an output signal of the AD converter 114 is fed to the other input terminal of the OR gate 140 and the other input terminal of the AND gate 142 via an inverter 144, and an output signal of the AD converter 116 is fed to one input terminal of an EX-OR gate 146. Applied to the other input terminal of the EX-OR gate 146 is an output signal of the AND gate 142.

Figure 14:
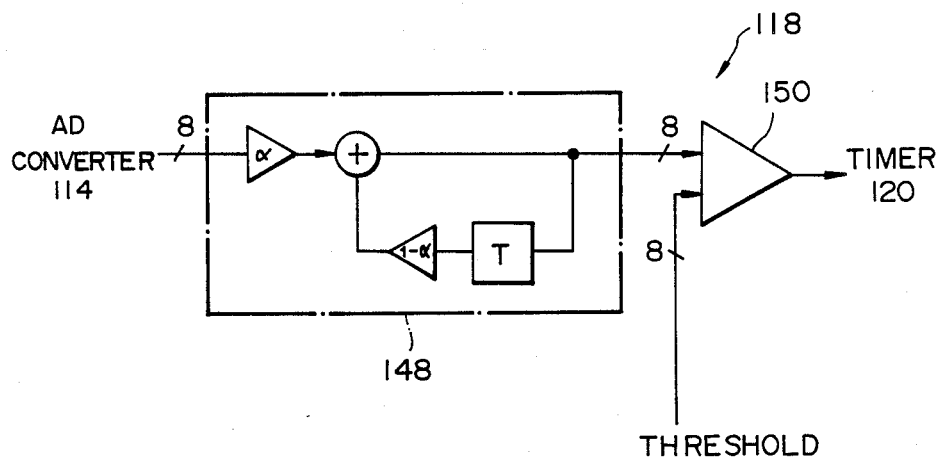
FIG. 14 is a schematic block diagram showing a specific construction of a carrier sensor which is included in the demodulator of FIG. 14.

FIG. 14 shows a specific construction of the carrier sensor 118 which is included in the demodulator 100. As shown, the carrier sensor 118 is constituted by an a/s+a type low-pass filter 148 and a level comparator 150. The level comparator 150 functions to compare an output level of the low-pass filter 148 with a threshold level.

The timer 120 may be implemented by a counter which is triggered by a signal that is produced by differentiating the positive-going edge of an output signal of the carrier sensor 118.

While the application of the present invention has been shown and described in relation to a phase detector having a one-phase or a bi-phase characteristic, it may be practiced even with a phase detector having a four-phase or an eight-phase characteristic for dealing with a quadrature or an octal PSK burst signal.

In summary, it will be seen that a PLL using a phase comparator of the present invention is allowed to rapidly converge to a stable point even when the phase error is close to an unstable point and therefore achieves a decrease in acquisition time. Since a phase error converting circuit included in the phase comparator of the present invention does not need a ROM or only needs a ROM having a small capacity, the phase comparator can be implemented by circuit parts which are inexpensive and easy to obtain. Further, the phase comparator requires a minimum number of parts and is therefore miniature.

Various modifications will become possible for those skilled in the art after receiving the teachings of the present disclosure without departing from the scope thereof.

What is claimed is:

1. A phase comparator for comparing two input signals with respect to phase in order to produce a phase difference between the two input signals, said comparator comprising:
   first multiplier means supplied with a modulated signal and a reference signal which constitute the two input signals for producing an output signal which is representative of a product of the modulation signal and the reference signal;
   first low-pass filter means for filtering the output signal of said first multiplier means to produce a first output signal;
   π/2 phase shifter means for shifting a phase of the reference signal by π/2 to produce a phase shifted output signal;

second multiplier means supplied with the modulated signal and the phase shifted output signal for producing an output signal which is representative of a product of the modulated signal and the phase shifted output signal;

second low-pass filter means for filtering the output signal of said second multiplier means to produce a second output signal;

polarity discriminator means supplied with one of the first and second output signals of said first low-pass filter means and said second low-pass filter means for producing a discrimination signal which is representative of a positive half and a negative half of a period of said one output signal; and phase error converting means supplied with the other of the first and second output signals of said first low-pass filter means and said second low-pass filter means and the discrimination signal for producing a phase error signal which, when said discrimination signal is representative of the positive half, monotonously increases within one period of said other output signal which is associated with said positive half.

2. A phase comparator as claimed in claim 1, wherein the modulated signal comprises at least one of a digitally modulated sine-wave component signal, a digitally modulated cosine-wave component signal, and a combination of the sine-wave component signal and the cosine-wave component signal, and the reference signal comprises at least one of a sine-wave component signal and a cosine-wave component signal.

3. A phase comparator as claimed in claim 2, wherein said first low-pass filter means filters the output signal of said first multiplier means to produce one of a sine component signal and a cosine component signal associated with the phase difference, and said second low-pass filter means filters the output signal of said second multiplier means to produce the other of the sine and cosine component signals.

4. A phase comparator as claimed in claim 3, wherein said phase error converting means comprises an analog-to-digital (AD) converter for converting the output signal of the second low-pass filter means into a digital signal having a predetermined number of bits to produce a digital output signal, a read-only memory (ROM) table supplied with the digital output signal of said AD converter and the discrimination signal for producing a predetermined phase error signal which is a digital signal, and a digital-to-analog (DA) converter supplied with the phase error signal for converting the phase error signal into an analog signal.

* * * * *